US011573873B1

(12) United States Patent
Guo et al.

(10) Patent No.: US 11,573,873 B1
(45) Date of Patent: Feb. 7, 2023

(54) ADAPTIVE CELL-AWARE TEST MODEL FOR CIRCUIT DIAGNOSIS

(71) Applicant: Synopsys, Inc., Mountain View, CA (US)

(72) Inventors: Ruifeng Guo, Hillsboro, OR (US); Ting-Pu Tai, Hsinchu (TW)

(73) Assignee: Synopsys, Inc., Mountain View, CA (US)

(*) Notice: Subject to any disclaimer, the term of this patent is extended or adjusted under 35 U.S.C. 154(b) by 35 days.

(21) Appl. No.: 17/381,922

(22) Filed: Jul. 21, 2021

Related U.S. Application Data

(60) Provisional application No. 63/054,670, filed on Jul. 21, 2020.

(51) Int. Cl.
*G06F 11/00* (2006.01)
*G01R 31/3183* (2006.01)
*G06F 11/27* (2006.01)
*G06F 17/18* (2006.01)

(52) U.S. Cl.
CPC ...... *G06F 11/27* (2013.01); *G01R 31/318342* (2013.01); *G06F 17/18* (2013.01); *G06F 2201/86* (2013.01)

(58) Field of Classification Search
CPC ...... G06F 11/27; G06F 17/18; G06F 2201/86; G01R 31/318342; G01R 31/318357; G01R 31/318364; G01R 31/31835
See application file for complete search history.

(56) References Cited

U.S. PATENT DOCUMENTS

| | | | |
|---|---|---|---|
| 2009/0210764 A1* | 8/2009 | Nozuyama | G06F 11/2252 714/E11.155 |
| 2015/0234978 A1* | 8/2015 | Tang | G06F 30/398 716/112 |
| 2018/0121587 A1* | 5/2018 | Monga | H01L 27/0886 |

\* cited by examiner

*Primary Examiner* — Christine T. Tu
(74) *Attorney, Agent, or Firm* — Patterson + Sheridan, LLP

(57) ABSTRACT

Systems and methods disclosed include receiving defect data from a test of a semiconductor device comprising a circuit, the circuit comprising a cell, the cell comprising a first input, a second input and an output, and modeling a first plurality of cell defect modes of the cell with a first multiple input transition cell fault model (MTCFM), the cell defect modes associated with a first signal transition on the first input, and a second signal transition on the second input or the output. Systems and method further include correlating the first plurality of cell defect modes to the defect data to produce a probability of each of the first plurality of cell defect modes matching the defect data, and providing, to a user, an indication of each of at least one of the first plurality of cell defect modes having the probability exceeding a defect probability threshold.

20 Claims, 7 Drawing Sheets

| A1 | A2 | X | DA | DB | DC | DD | DE | ... |
|----|----|---|----|----|----|----|----|-----|
| R  | 0  | 0 | 1  | 1  |    |    | 1  | ... |
| F  | 0  | 0 |    |    |    | 1  |    | ... |
| R  | 1  | R | 1  |    |    | 1  |    | ... |
| F  | 1  | F |    | 1  |    |    |    | ... |
| 0  | R  | 0 |    |    |    |    |    | ... |
| 0  | F  | 0 |    |    |    |    | 1  | ... |
| 1  | R  | R | 1  |    | 1  |    |    | ... |
| 1  | F  | F |    |    | 1  | 1  |    | ... |
| ...| ...|...| ...| ...| ...| ...| ...| ... |

FIG. 2A

| A1 | A2 | A3 | X | DF | DG | DH | DI | DJ | ... |
|----|----|----|---|----|----|----|----|----|-----|
| R  | 0  | 0  | 0 | 1  |    |    | 1  |    | ... |
| F  | 0  | 1  | 1 |    |    | 1  |    |    | ... |
| R  | 1  | 0  | R |    |    | 1  |    | 1  | ... |
| F  | 1  | 1  | F | 1  |    |    |    |    | ... |
| 0  | R  | 0  | 0 |    |    |    |    |    | ... |
| 0  | F  | 1  | 1 |    |    |    | 1  |    | ... |
| 1  | R  | 0  | R |    | 1  |    |    |    | ... |
| 1  | F  | 1  | F |    | 1  | 1  |    |    | ... |
| 0  | 0  | R  | 0 | 1  | 1  |    | 1  | 1  | ... |
| ...| ...| ...|...| ...| ...| ...| ...| ...| ... |

FIG. 2B

|     | 308a |     | 312a | 316a |     |     |     |     |
|-----|------|-----|------|------|-----|-----|-----|-----|
|     | A1   | A2  | X    | DK   | DL  | DM  | DN  | DO  | ... |
| 320a→ | R  | F   | 0    |      | 1   |     | 1   | 1   | ... |
|     | F    | F   | 1    |      |     |     |     |     | ... |
|     | R    | R   | 0    | 1    |     |     | 1   |     | ... |
|     | F    | R   | 1    |      | 1   |     | 1   |     | ... |
|     | R    | F   | R    |      |     | 1   |     |     | ... |
|     | F    | F   | F    |      |     |     |     | 1   | ... |
|     | R    | R   | R    | 1    |     |     |     | 1   | ... |
|     | F    | R   | F    |      | 1   | 1   | 1   | 1   | ... |
|     | ...  | ... | ...  | ...  | ... | ... | ... | ... | ... |

304a → (row header); 300a (table)

FIG. 3A

|     | 308b |     |     | 312b | 316b |     |     |     |     |
|-----|------|-----|-----|------|------|-----|-----|-----|-----|
|     | A1   | A2  | A3  | X    | DP   | DQ  | DR  | DS  | DT  | ... |
| 320b→ | R  | 0   | R   | 0    | 1    | 1   |     | 1   | 1   | ... |
|     | F    | 0   | R   | 1    |      |     | 1   |     |     | ... |
|     | R    | 1   | F   | R    |      |     | 1   |     | 1   | ... |
|     | F    | 1   | F   | F    | 1    |     |     |     |     | ... |
|     | 0    | R   | R   | 0    |      |     |     |     |     | ... |
|     | 0    | F   | F   | 1    |      |     |     | 1   |     | ... |
|     | R    | R   | F   | R    |      | 1   |     |     |     | ... |
|     | F    | F   | 1   | F    |      | 1   | 1   |     |     | ... |
|     | F    | R   | R   | 0    | 1    |     |     | 1   |     | ... |
|     | ...  | ... | ... | ...  | ...  | ... | ... | ... | ... | ... |

304b → (row header); 300b (table)

FIG. 3B

ADAPTIVE CELL-AWARE TEST MODEL FOR CIRCUIT DIAGNOSIS

RELATED APPLICATION

This application claims the benefit of provisional patent application 63/054,670, filed on Jul. 21, 2020, which is incorporated herein by reference in its entirety.

TECHNICAL FIELD

The present disclosure relates to circuit failure analysis, and more particularly, to the identification of a cell having a defect within a circuit.

BACKGROUND

Semiconductor manufacturing technologies have been progressing rapidly, for example, from planar field-effect transistor (FET), to a fin field-effect transistor (FinFET), to gate-all-around (GAA) FET or multi-bridge channel FET (MBCFET) with structural dimensions of 5 nm and smaller. Transistor designs are becoming increasingly complex, and defects related to transistors are becoming increasingly subtle with marginal behaviors. Discovery and subsequent diagnosis of such defects for physical analysis and yield are becoming challenging as a result.

Logic diagnoses on stuck-at transition fault models are conventionally used to facilitate defect detection and diagnosis for yield analysis. Conventional fault diagnosis models are typically limited to modeling faults having a single signal transition input to a cell.

SUMMARY

Certain embodiments provide a method that includes receiving defect data from a test of a semiconductor device comprising a circuit, the circuit comprising a cell, the cell comprising a first input, a second input and an output, modeling a first plurality of cell defect modes of the cell with a first enhanced cell-aware test model (ECTM), the cell defect modes associated with a first signal transition on the first input, and a second signal transition on the second input or the output. The method further includes correlating the first plurality of cell defect modes to the defect data to produce a probability of each of the first plurality of cell defect modes matching the defect data, and providing, to a user, an indication of each of at least one of the first plurality of cell defect modes having the probability exceeding a defect probability threshold.

Other embodiments provide: processing systems configured to perform the aforementioned methods as well as those described herein; non-transitory, computer-readable media comprising computer-readable instructions that, when executed by one or more processors of a processing system, cause the processing system to perform the aforementioned methods as well as those described herein; a computer program product embodied on a computer-readable storage medium comprising code for performing the aforementioned methods as well as those further described herein; and a processing system comprising means for performing the aforementioned methods as well as those further described herein.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIGS. 2A & B depict cell fault models (CFMs) according to certain embodiments.

FIGS. 3A & B depicts a multiple input transition cell-aware test models (MTCFMs), according to certain embodiments.

DETAILED DESCRIPTION

Figure 1:
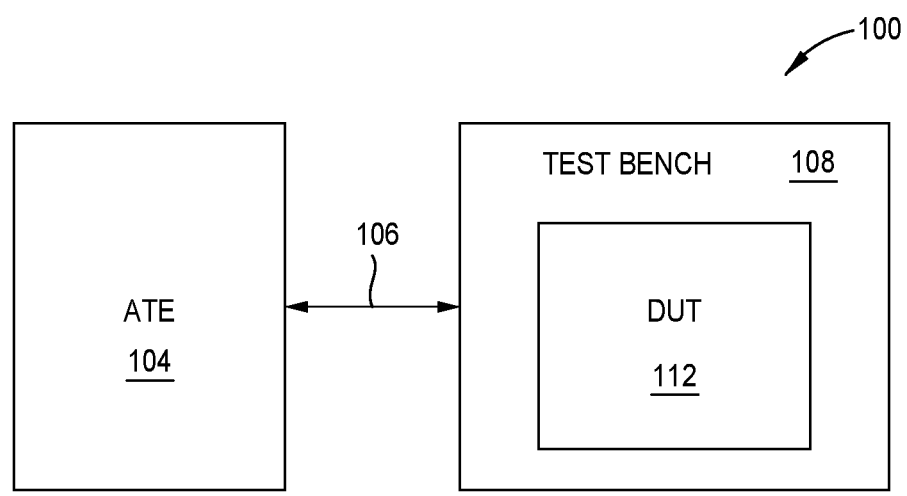
FIG. 1 depicts an automated test bench for testing a circuit, according to certain embodiments.

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Aspects of the present disclosure relate to an adaptive cell-aware test model for circuit diagnosis. A fabricated circuit in silicon design under test (DUT) may be tested by automated test equipment (ATE). The output of the ATE is conventionally provided as a number of failures detected in the fabricated circuit. The circuit design upon which the fabricated circuit is tested is the modeled in a cell fault model (CFM) that models defect modes with one or more vectors that define and model a cell defect modes having up to one input pin with a transition signal (e.g., a rising or falling signal), while the remaining input pins are of a constant value (e.g., 0 or 1), and showing where in the circuit design that defects modeled with a CFM may occur, such as in an identified cell or group of cells. CFM If a defect mode detected by the ATE is of a type not modeled by the CFM CFM (e.g., a failure having an input state with transition signals on multiple inputs), it may be difficult to identify the defect mode and correlate the defect detected by the ATE to an location of the design for analysis with a sufficiently high probability.

As circuit designs become increasingly complex and the number of transistors utilized in a cell of a circuit element increases, defect modes are becoming increasingly complex and difficult to detect and associate with a particular cell. Moreover, the number and types of defect modes will increasingly include transition inputs on more than one cell input.

Certain embodiments of the present disclosure are directed to a multiple input transition CFM (MTCFM) that models transition signals on multiple input pins of a cell CFM Whereas a CFM may model a transition signal on a single input, with the remaining inputs modeled as constant, the MTCFM additionally models defect modes having transition signals on more than one cell input. As a result, when utilizing the MTCFM, different, and potentially more, defect modes may be detected, thereby increasing the probability of accurately identifying the defect mode detected by the ATE and determining the cell location of the error within the design.

To utilize MTCFM in cell fault diagnosis, output from the ATE that indicates faults in a circuit may be initially modeled using a CFM, and where faults are identified with sufficiently high probability (e.g., as set by test policy or user preference), and located within the design, the identified faults may be further investigated by failure analysis personnel. Where faults detected by the ATE cannot be correlated to the CFM CFM or where faults are identified with a low probability, the circuit may be adaptively modeled by a MTCFM. The MTCFM results are correlated to ATE detected faults and further investigated by failure analysis personnel.

By providing additional defect modes enabled by the MTCFM that models defect modes including more than one transition input signal, a greater number of potential errors may be identified and correlated to defective cells of a circuit design detected by the ATE. By enabling a greater range of identifiable defect modes, in addition to correlating these to cells of a design, defective chips may be prevented from entering the supply chain, and defects in a design may be corrected, resulting in higher quality products.

FIG. 1 depicts an automated test bench 100 for testing a circuit, according to certain embodiments. Automated test equipment (ATE) 104 is coupled to a test bench 108 via a general-purpose I/O (GPIO) 106 to provide automated test patterns (not shown) to test design under test (DUT) 112 and provide results of the application of test patterns back to the ATE 104. As an example output, the ATE 104 provides a number of bad cells (also referred to at 'bits'). In this context, the DUT 112 may be a semiconductor device comprising one or more circuits, such as an application-specific instruction chip (ASIC), a memory chip, a central processing unit (CPU), or any other fabricated silicon device, or component thereof, that may be packaged or unpackaged.

FIGS. 2A & B depict a cell fault model (CFM) 200a and 200b according to certain embodiments. A CFM models defect modes with one or more vectors that define defect modes of a cell having up to one input pin with a transition signal (e.g., rising or falling signal), while the remaining input pins are at a constant value (e.g., 0 or 1), and provide a location of cells modeled to have modeled defects, either as individual cells, or within a group of cells. The CFM 200a includes a definition CFM vector 204a that defines inputs, outputs, and defect modes of the CFM 200a. A CFM such as CFM 200a models a transitional signal on one input pin, and steady signals in the remaining input pins. As an output, a CFM may return a number of defective cells (also referred to as 'bits') that are correlated to the output of the ATE by comparing the number of defective cells from the ATE 104, discussed below. By way of example and not limitation, the definition CFM vector 204a depicted includes two input pins 208a A1 and A2, an output pin 212a X, and a plurality of defect modes 216a DA, DB, DC, DD, and DE according to certain embodiments. Although the defect modes are shown here by way of example as DA, DB, and so forth, one of skill in the art may understand defects to be represented numerically, such as D1, D35, D256. By representing as letters herein, it is understood that a given defect designation may be any defect designation (e.g., any particular numerical designation) assigned for a particular modeling representation, and is not limiting to any particular embodiment. Although two input pins 208a and one output pin 212a are depicted, there may be more input pins and more output pins depending on the circuit and cell designs under test; although five defect modes 216a are depicted, there may be any number of defect modes depending of the design of the circuit under test.

An input on the two input pins 208a for CFM 200a can include a steady signal such as a 1 or a 0 on one pin and a transitional signal such as a rising signal indicated by an "R," or a falling signal indicated by an "F" on the other pin. Defect modes associated with the input pin and output pin states are depicted by a capital D followed by a letter, such as "DA", "DB", and so forth, according to the depicted embodiment. As would be appreciated by one of skill in the art, representations of input pins, output pins, and defect modes may be different than those depicted. By way of example, for input pins 208a, a defect mode vector 220a of CFM 200 indicates a rising signal "R" signal on pin A1 and a steady signal "0" on pin A2. For the output pin 212a, a rising steady signal "0" is shown, although a transitional signal may be present on output pin 212a. Defect modes "DA," "DB," "DC," "DD," and "DE" are shown for this particular input/output pin state configuration for a particular design. Defect modes 216a for a particular DUT, circuit, and/or cell (or group of cells) may be determined from a variety of sources, such as historical test results of cells, simulations, and observations from the test of other designs and cells. Although a particular configuration for CFM 200 is shown, there may be any variety of configurations, limited only by the number of different possible configurations of cells and circuits that may be modeled by the CFM 200. Ellipses in the depicted examples indicate that there may be additional rows and columns in for the vector definitions and values.

CFM 200b depicts an example of more than two input pins. CFM 200b includes a definition CFM vector 204b that defines inputs, outputs, and defect modes of the CFM 200b. A CFM such as CFM 200b models a transitional signal on one input pin, and steady signals in the remaining input pins. As an output, a CFM may return a number of defective cells (also referred to as 'bits') that are correlated to the output of the ATE by comparing the number of defective cells from the ATE 104, discussed below. By way of example and not limitation, the definition CFM vector 204b depicted includes three input pins 208b A1, A2, and A3, an output pin 212b X, and a plurality of defect modes 216b "DF," "DG," "DH," "DI," and "DJ," according to certain embodiments. Although three input pins 208b and one output pin 212b are depicted, there may be more input pins and more output pins depending on the circuit and cell designs under test; although five defect modes 216b are depicted, there may be any number of defect modes.

Inputs on the three input pins 208b for CFM 200b can include a steady signal such as a 1 or a 0 on two input pins and a transitional signal such as a rising or falling signal indicated by an "R" or a falling signal indicated by an "F" on the remaining pin. Defect modes associated with the input pin and output pin states are depicted by a capital D followed by a letter, such as "DF", "DG", and so forth, according to the depicted embodiment. As would be appreciated by one of skill in the art, representations of input pins, output pins, and defect modes may be different than those depicted. By way of example, for input pins 208b, a defect mode vector 220b of CFM 200b indicates a rising signal "R" signal on pin A1 a steady signal "0" on pin A2, and a steady signal "0" on pin A3. For the output pin 212b, a steady signal "0" is shown, although a transitional signal may be present on output pin 212b. Defect modes "DF", "DG" "DH," etc., are shown for this particular input/output pin state configuration for a particular design. Defect modes 216b for a particular DUT, circuit, and/or cell (or group of cells) may be determined from a variety of sources, such as historical test results of cells, simulations, and observations from the test of other designs and cells. Although a particular configuration for CFM 200b is shown, there may be any variety of configurations, limited only by the number of different possible configurations of cells and circuits that may be modeled by the CFM 200b.

FIGS. 3A & B depicts a multiple input transition cell-aware test model (MTCFM) 300a and 300b, according to certain embodiments. A MTCFM models defect modes with one or more vectors that define defect modes of a cell more than one input pin with a transition signal (e.g., rising or falling signal), while the remaining input pins are at a constant value (e.g., 0 or 1), and provide a location of cells modeled to have modeled defects, either as individual cells, or within a group of cells. The ECFM 300a includes a definition ECFM vector 304a that defines inputs, outputs, and defect modes of the ECFM 300a. A MTCFM such as MTCFM 300a models a transitional signal two or more input pins. As an output, a MTCFM may return a number of defective cells (also referred to as 'bits') that are correlated to the output of the ATE by comparing the number of defective cells from the ATE 104, discussed below. By way of example and not limitation, the definition MTCFM vector 304a depicted includes two input pins 308a A1 and A2, an output pin 312a X, and a plurality of defect modes 316a DK, DL, DM, DN, and DO according to certain embodiments. Although two input pins 308a and one output pin 312a are depicted, there may be more input pins and more output pins depending on the circuit and cell designs under test; although five defect modes 316a are depicted, there may be any number of defect modes depending on the circuit under test.

Inputs on the three input pins 308a for MTCFM 300a can include a transitional signal such as a rising signal indicated by an "R," or a falling signal indicated by an "F" on either pin. Defect modes associated with the input pin and output pin states are depicted by a capital D followed by a letter, such as "DK", "DL", and so forth, according to the depicted embodiment. As would be appreciated by one of skill in the art, representations of input pins, output pins, and defect modes may be different than those depicted. By way of example, for input pins 308a, a defect mode vector 320a of MTCFM 300a indicates a rising signal "R" signal on pin A1 and a falling signal "F" on pin A2. Defect modes "DK," "DL," "DM," "DN" and "DO" are shown for this particular input/output pin state configuration for a particular design. Defect modes 316a for a particular DUT, circuit, and/or cell (or group of cells) may be determined from a variety of sources, such as historical test results of cells, simulations, and observations from the test of other designs and cells. Although a particular configuration for MTCFM 300a is shown, there may be any variety of configurations, limited only by the number of different possible configurations of cells and circuits that may be modeled by the MTCFM 300a.

MTCFM 300b depicts an example of more than two input pins. MTCFM 300b includes a definition MTCFM vector 304b that defines inputs, outputs, and defect modes of the MTCFM 300b. A MTCFM such as MTCFM 300b models a transitional signal on more than one input pin. As an output, an MTCFM may return a number of defective cells (also referred to as 'bits') that are correlated to the output of the ATE by comparing the number of defective cells from the ATE 104, discussed below. By way of example and not limitation, the definition MTCFM vector 304b depicted includes three input pins 308b A1, A2, and A3, an output pin 312b X, and a plurality of defect modes 316b "DP," "DQ," "DR," "DS," and "DT," according to certain embodiments. Although three input pins 308b and one output pin 312b are depicted, there may be more input pins and more output pins depending on the circuit and cell designs under test; although five defect modes 316b are depicted, there may be any number of defect modes.

Inputs on the three input pins 308b for MTCFM 300b can include a rising or falling signal on two or more of the input pins, and a steady signal on pins that do not have a transitional signal. Defect modes associated with the input pin and output pin states are depicted by a capital D followed by a letter, such as "DP", "DQ", and so forth, according to the depicted embodiment. As would be appreciated by one of skill in the art, representations of input pins, output pins, and defect modes may be different than those depicted. By way of example, for input pins 308b, a defect mode vector 320b of MTCFM 300b indicates a rising signal "R" signal on pin A1 a steady signal "0" on pin A2, and a rising signal "R" on pin A3. For the output pin 312b, a steady signal "0" is shown, although a transitional signal may be present on output pin 312b. Defect modes "DP", "DQ" "DR," etc., are shown for this particular input/output pin state configuration for a particular design. Defect modes 316b for a particular DUT, circuit, and/or cell (or group of cells) may be determined from a variety of sources, such as historical test results of cells, simulations, and observations from the test of other designs and cells. Although a particular configuration for MTCFM 300b is shown, there may be any variety of configurations, limited only by the number of different possible configurations of cells and circuits that may be modeled by the MTCFM 300b.

Figure 4:
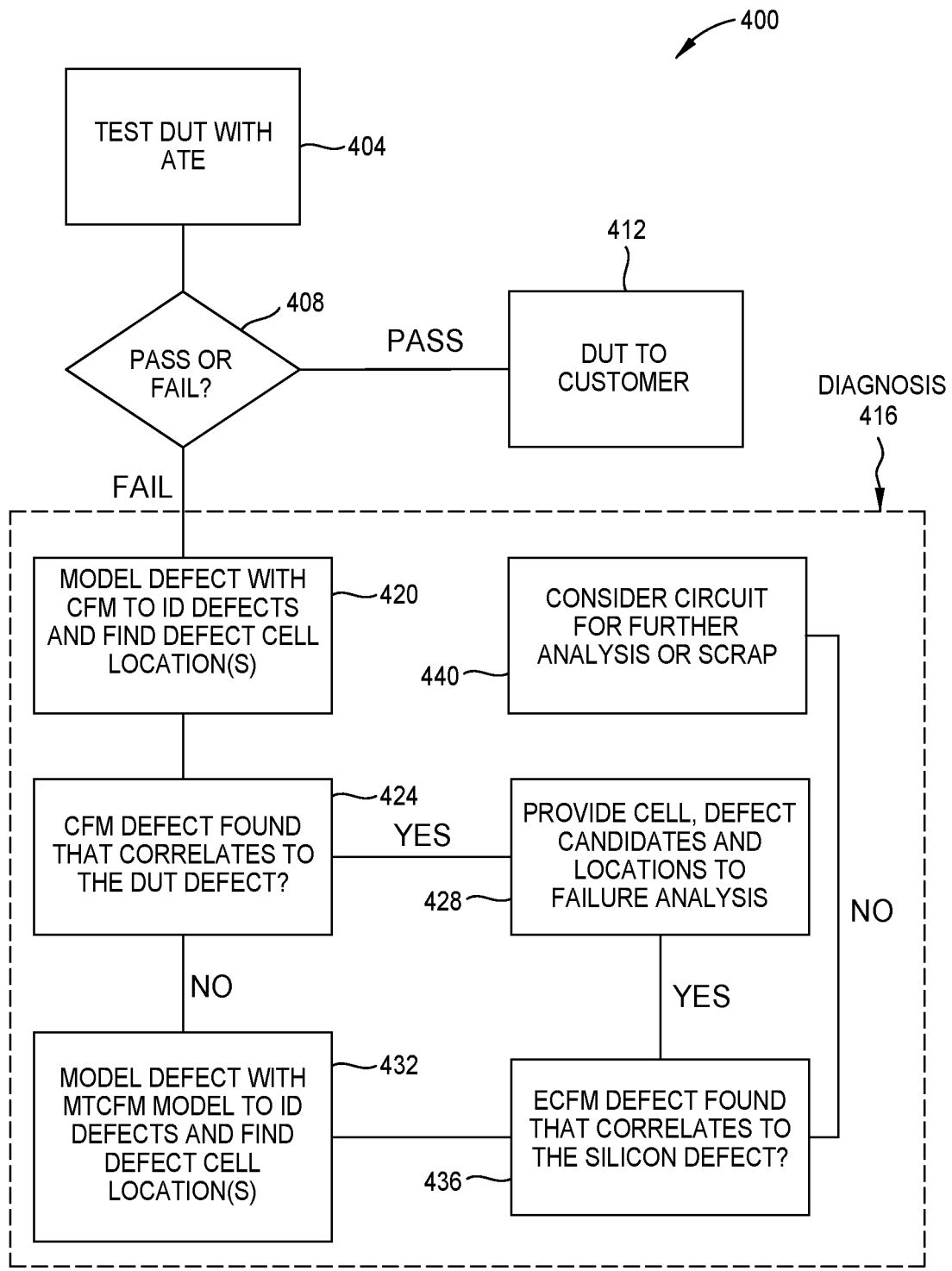
FIG. 4 depicts a flow diagram for modeling defective cells of a design under test, according to certain embodiments.

FIG. 4 depicts a flow diagram 400 for modeling defective cells of a design under test, according to certain embodiments. At block 404, DUT 112, circuit elements, and cells that make up the circuit elements are tested on automated test equipment (ATE) 104. If the DUT 112 is determined at block 408 to have passed, the DUT 112 is provided to the customer at block 412. At block 408, if the DUT 112 is determined to have one or more defects that affect the operation of the circuit, it is deemed to have failed and provided for diagnosis 416.

As part of diagnosis, cells of the DUT are modeled with a CFM such as CFM 200a or CFM 200b, to identify one or more defects detected in the DUT 112 at block 420. The defect modes of the CFM for the DUT 112 are compared to the defects found during the test performed at block 404, and if one or more defects can be correlated at block 424 to a modeled defect mode of the CTM, those defects and estimated cell locations are passed to failure analysis at block 428. In this context, correlation means that cell defects can be mapped to a modeled defect mode with a sufficiently high probability, according to certain embodiments. According to certain embodiments, correlating CFM defects (i.e., defective cells) may include comparing the number of defects from the CFM 200*a* or 200*b* to the number of defects found in testing the fabricated circuit with the ATE 104 of FIG. 1. For example, if there are 100 defective cells detected at the ATE 104, modeling with a first CFM having a first configuration of defect mode vectors that cause the first CFM to match 40 of the defective cells from the ATE 104 has a 40% correlation to the ATE defects. A second modeling with a second CFM with a second configuration of defect mode vectors that cause the second CFM to match 30 defective cells from the ATE has a 30% correlation to the ATE defects. A sufficiently high probability may be determined by lab policy, by a user, or algorithmically determined based on the DUT and CFM for the DUT. A higher probability score may be obtained by additionally modeling the design with a MTCFM model as mentioned below, that additionally models transitions on multiple inputs of cells of a design. In certain embodiments, the probability may be 50% or greater.

If no CFM defect mode correlates or does not correlate with a sufficiently high probability to the defect at block 424, the DUT 112 is adaptively, or additionally, modeled at block 432 with a MTCFM such as MTCFM 300*a* or MTCFM 300*b* of FIG. 3. In this context, the DUT 112 is additionally, or "adaptively" modeled with MTCFM in circumstances where CFM modeling did did not result in defect modes correlating to detected defects. Modeling with MTCFM allows usage of defect modes resulting from a transition signal on more than one input and/or output pin of the DUT 112, as explained above in connection with FIG. 3. Because MTCFM may be more computationally expensive, it is employed when the CFM does not result in correlating defect modes, according to certain embodiments. In some embodiments, modeling may be done with both CFM and MTCFM.

At block 436, if a defect mode modeled by the MTCFM is found that correlates to one or more defects of the DUT, or correlates with sufficiently high probability, the modeled defect modes and associated cell locations are provide for failure analysis at block 428. If no correlating defect modes are found, or none with a sufficiently high probability, the DUT is considered for further analysis or scrap, at block 440.

By adaptively modeling a DUT using CFM to correlate defects to defect modes and modeling the DUT using MTCFM only when CFM does not provide sufficiently correlated results to detected defects of the DUT, MTCFM modeling may be invoked when CFM modeling is not sufficient. As a result, accurate modeling results may be determined that identify defect modes and location of cells having these defect modes, utilizing computer resources only when needed to provide MTCFM modeling.

Figure 5:
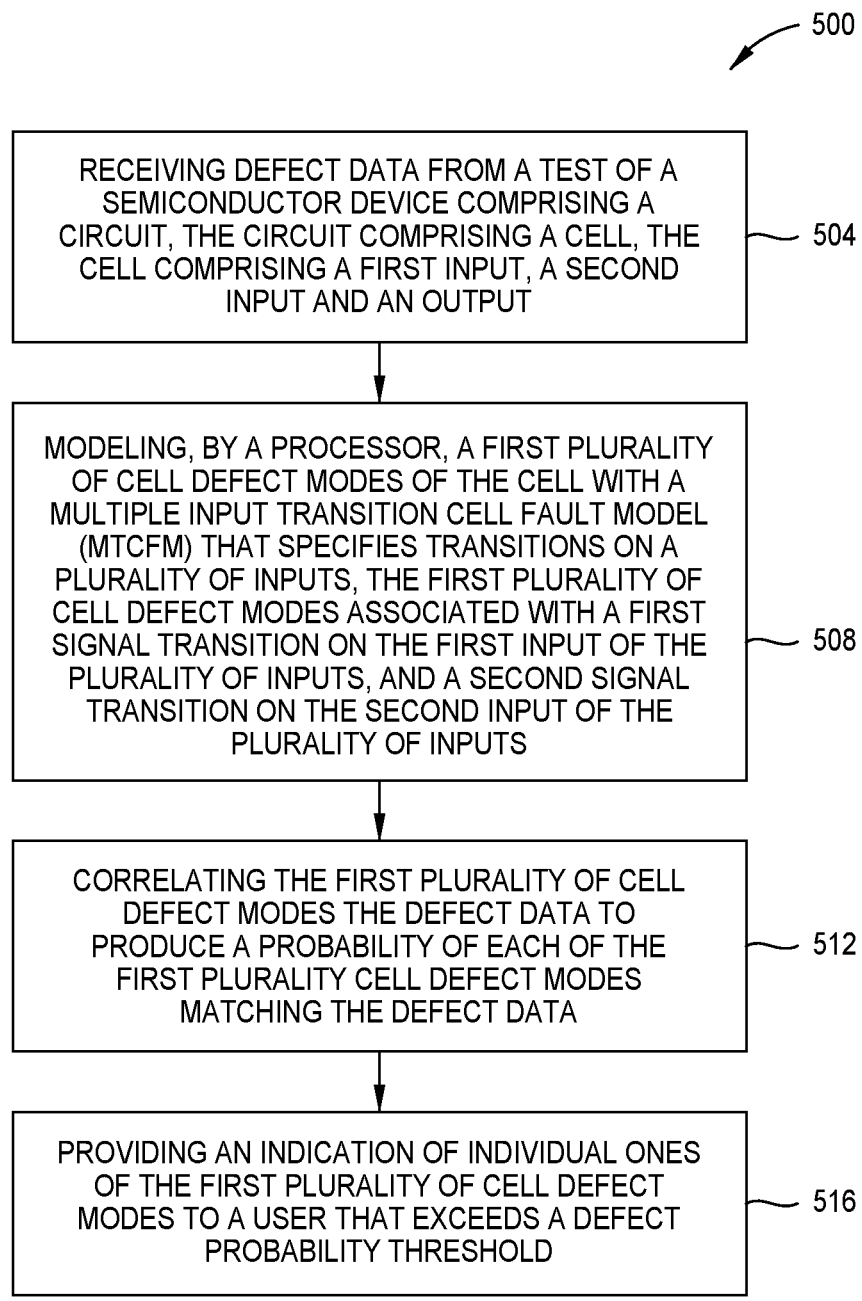
FIG. 5 depicts a method for adaptive cell modeling, according to certain embodiments.

FIG. 5 depicts a method 500 for adaptive cell modeling, according to certain embodiments. The method 500 may be performed by a testing system implemented using a processing device, such as the processing device 702 described with respect to FIG. 7.

At block 504, the testing system receives defect data from a test of a semiconductor device comprising a circuit. The circuit may include a cell having a first input, a second input, and an output.

At block 508, the testing system models, with a processor, a first plurality of cell defect modes of the cell with a multiple input transition cell fault model (MTCFM) that specifies transitions on a plurality of inputs, the first plurality of cell defect modes associated with a first signal transition on the first input of the plurality of inputs, and a second signal transition on the second input of the plurality of inputs.

At block 512, the testing system correlates the first plurality of cell defect modes the defect data to produce a probability of each of the first plurality cell defect modes matching the defect data.

At block 516, the testing system provides an indication of each of at least one of the first plurality of cell defect modes having the probability exceeding a defect probability threshold. According to certain embodiments, the testing system provides a location in the cell for each of the individual ones of the first plurality of cell defect modes that exceeds the defect probability threshold.

According to certain embodiments, the testing system models a second plurality of cell defect modes are being associated with a third transition signal on the first input, and a constant signal on the second input.

Figure 6:
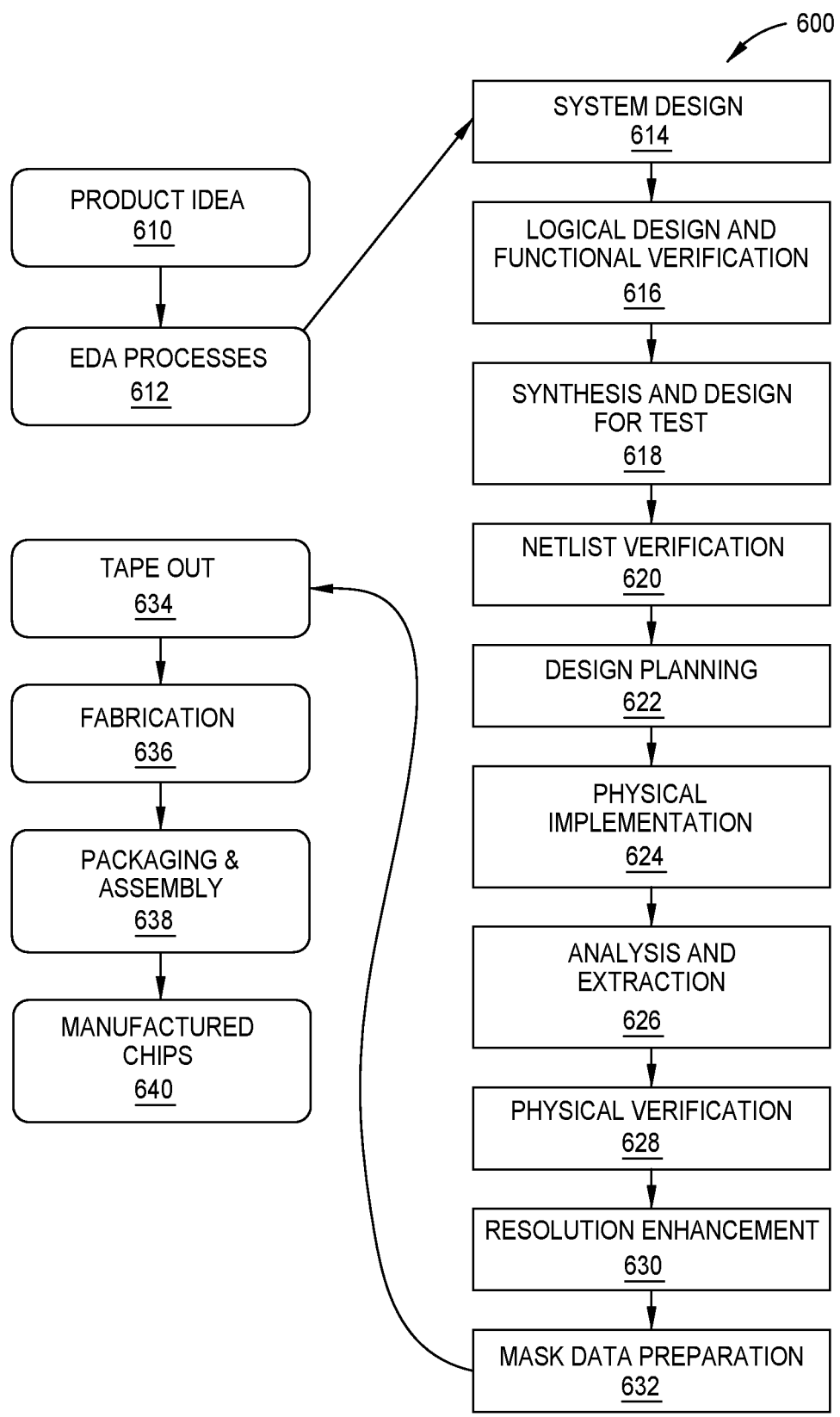
FIG. 6 depicts a flowchart of various processes used during the design and manufacture of an integrated circuit in accordance with some embodiments of the present disclosure.

FIG. 6 illustrates an example set of processes 600 used during the design, verification, and fabrication of an article of manufacture, such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 610 with information supplied by a designer, information which is transformed to create an article of manufacture that uses a set of EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly processes 638 are performed to produce the finished integrated circuit 640.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 6. The processes described by be enabled by EDA products (or tools).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as test bench generators, static HDL checkers, and formal verifiers. In some embodiments, special systems of components referred to as 'emulators' or 'prototyping systems' are used to speed up the functional verification.

During synthesis and design for test 618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist is checked for compliance with timing constraints and for correspondence with the HDL code. During design planning 622, an overall floor plan for the integrated circuit is constructed and analyzed for timing and top-level routing.

During layout or physical implementation 624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flip-flop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 626, the circuit function is verified at the layout level, which permits refinement of the layout design. During physical verification 628, the layout design is checked to ensure that manufacturing constraints are correct, such as DRC constraints, electrical constraints, lithographic constraints, and that circuitry function matches the HDL design specification. During resolution enhancement 630, the geometry of the layout is transformed to improve how the circuit design is manufactured.

During tape-out, data is created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 700 of FIG. 7) may be used to store the programs and data structures that are used by some or all of the EDA products described herein, and products used for development of cells for the library and for physical and logical design that use the library.

Figure 7:
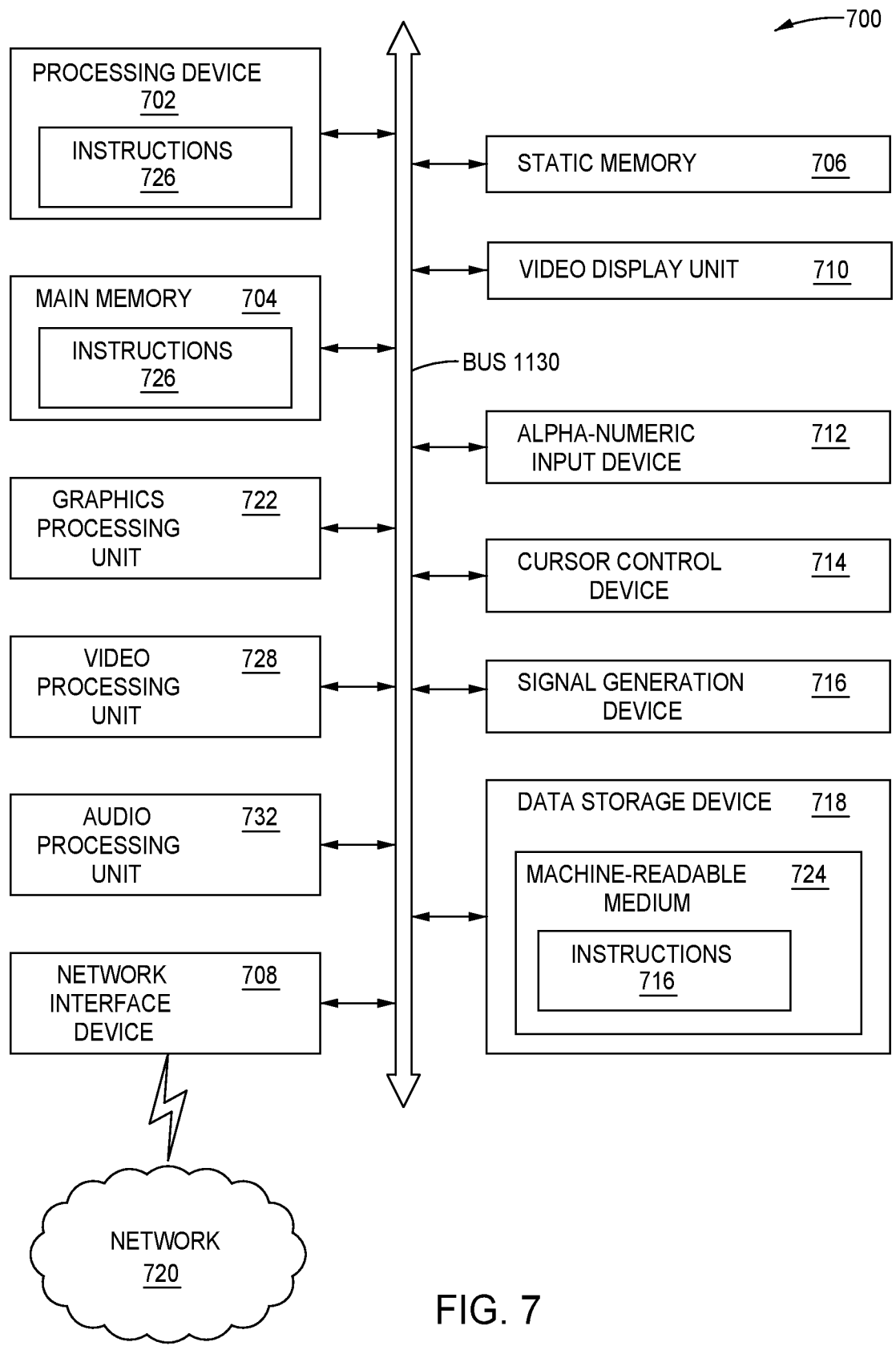
FIG. 7 depicts an abstract diagram of an example computer system in which embodiments of the present disclosure may operate according to certain embodiments.

FIG. 7 illustrates an example machine of a computer system 700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
   receiving design data comprising a circuit that includes a cell, the cell comprising a first input, a second input, and an output;
   receiving defect data from a test of a semiconductor device based on the design data;
   modeling, by a processor, a first plurality of cell defect modes of the cell with a multiple input transition cell fault model (MTCFM) that specifies transitions on a plurality of inputs, the first plurality of cell defect modes associated with a first signal transition on the first input of the plurality of inputs, and a second signal transition on the second input of the plurality of inputs;
   correlating the first plurality of cell defect modes to the defect data to produce a probability of each of the first plurality of cell defect modes matching the defect data; and
   providing an indication of each of at least one of the first plurality of cell defect modes having the probability exceeding a defect probability threshold.

2. The method of claim 1, further comprising providing a location in the design data for each of the at least one of the first plurality of cell defect modes that exceeds the defect probability threshold.

3. The method of claim 1, further comprising providing a location of a group of cells comprising the cell for each of the at least one of the first plurality of cell defect modes that exceeds the defect probability threshold.

4. The method of claim 1, further comprising:
   modeling a second plurality of cell defect modes of the cell with a cell fault model (CFM), one of the second plurality of cell defect modes being associated with a third transition signal on the first input and a constant signal on the second input.

5. The method of claim 4, wherein one of the second plurality of cell defect modes is associated with the third transition signal on the second input and the constant signal on the first input.

6. The method of claim 4, wherein one of the second plurality of cell defect modes is associated with a constant signal or transition signal on the output.

7. The method of claim 4, wherein the second plurality of cell defect modes are correlated to other defect data that is different from the defect data.

8. A system comprising:
   a memory for storing computer-readable instructions; and a processor, coupled with the memory and configured to execute the computer-readable instructions, the instructions when executed by the processor, cause the system to:
    receive design data comprising a circuit comprising a cell, the cell comprising a first input, a second input, and an output;
    receive defect data from a test of a semiconductor device based on the design data;
    model a first plurality of cell defect modes of the cell with a multiple input transition cell fault model (MTCFM) that specifies transitions on a plurality of inputs, the first plurality of cell defect modes associated with a first signal transition on the first input of the plurality of inputs, and a second signal transition on the second input of the plurality of inputs;
    correlate the first plurality of cell defect modes to the defect data to produce a probability of each of the first plurality of cell defect modes matching the defect data; and
    provide, an indication of each of at least one of the first plurality of cell defect modes having the probability exceeding a defect probability threshold.

9. The system of claim 8, the computer-readable instructions further causing the system to provide a location in the design data for each of the at least one of the first plurality of cell defect modes that exceeds the defect probability threshold.

10. The system of claim 8, further comprising computer-readable instructions that further cause the system to provide a location of a group of cells comprising the cell for each of the at least one of the first plurality of cell defect modes that exceeds the defect probability threshold.

11. The system of claim 8, the computer-readable instructions further cause the system to model a second plurality of cell defect modes of the cell with a cell fault model (CFM), the defects being associated with a third transition signal on the first input.

12. The system of claim 11, wherein one of the second plurality of cell defect modes is associated with the third transition signal on the second input and a constant signal is on the first input.

13. The system of claim 11, wherein one of the second plurality of cell defect modes is associated with a constant signal or transition signal on the output.

14. The system of claim 11, wherein the second plurality of cell defect modes are correlated to other defect data that is different from the defect data.

15. A non-transitory computer-readable medium comprising computer-readable instructions, which when executed by a processor, cause the processor to:
    receive design data comprising a circuit comprising a cell, the cell comprising a first input, a second input, and an output;
    receive defect data from a test of a semiconductor device based on the design data;
    model a first plurality of cell defect modes of the cell with a multiple input transition cell fault model (MTCFM) that specifies transitions on a plurality of inputs, the first plurality of cell defect modes associated with a first signal transition on the first input of the plurality of inputs, and a second signal transition on the second input of the plurality of inputs;
    the first plurality of cell defect modes to the defect data to produce a probability of each of the first plurality of cell defect modes matching the defect data; and
    provide, an indication of each of at least one of the first plurality of cell defect modes having the probability exceeding a defect probability threshold.

16. The non-transitory computer-readable medium of claim 15, the computer-readable instructions further causing the processor to provide a location in the design data for each of the at least one of the first plurality of cell defect modes that exceeds the defect probability threshold.

17. The non-transitory computer-readable medium of claim 15, wherein further comprising computer-readable instructions that further cause the processor to provide a location of a group of cells comprising the cell for each of the at least one of the plurality of cell defect modes that exceeds the defect probability threshold.

18. The non-transitory computer-readable medium of claim 15, the computer-readable instructions further causing the processor to model a second plurality of cell defect modes of the cell with a cell fault model (CFM), the defects being associated with a third transition signal on the first input.

19. The non-transitory computer-readable medium of claim 18, wherein one of the second plurality of cell defect modes is associated with the third transition signal on the second input and a constant signal is on the first input.

20. The non-transitory computer-readable medium of claim 18 wherein the second plurality of cell defect modes are correlated to other defect data that is different from the defect data.

* * * * *